United States Patent
Yu et al.

(10) Patent No.: US 8,872,020 B2
(45) Date of Patent: *Oct. 28, 2014

(54) HETEROJUNCTION SOLAR CELL BASED ON EPITAXIAL CRYSTALLINE-SILICON THIN FILM ON METALLURGICAL SILICON SUBSTRATE DESIGN

(71) Applicant: Silevo, Inc., Fremont, CA (US)

(72) Inventors: Chentao Yu, Sunnyvale, CA (US); Jiunn Benjamin Heng, Redwood City, CA (US); Zheng Xu, Pleasanton, CA (US); Jianming Fu, Palo Alto, CA (US); Jianjun Liang, Fremont, CA (US)

(73) Assignee: Silevo, Inc., Fremont, CA (US)

( * ) Notice: Subject to any disclaimer, the term of this patent is extended or adjusted under 35 U.S.C. 154(b) by 38 days.

This patent is subject to a terminal disclaimer.

(21) Appl. No.: 13/626,740

(22) Filed: Sep. 25, 2012

(65) Prior Publication Data

US 2013/0112265 A1    May 9, 2013

Related U.S. Application Data

(63) Continuation-in-part of application No. 12/401,314, filed on Mar. 10, 2009, now Pat. No. 8,283,557.

(51) Int. Cl.
| | |
|---|---|
| H01L 31/00 | (2006.01) |
| H01L 31/18 | (2006.01) |
| H01L 31/20 | (2006.01) |
| H01L 31/0747 | (2012.01) |

(52) U.S. Cl.
CPC ........... *H01L 31/0747* (2013.01); *Y02E 10/547* (2013.01); *H01L 31/1804* (2013.01); *H01L 31/202* (2013.01); *H01L 31/18* (2013.01)

USPC .......................................................... 136/255

(58) Field of Classification Search
USPC .......................................................... 136/255
See application file for complete search history.

(56) References Cited

U.S. PATENT DOCUMENTS

| | | | | |
|---|---|---|---|---|
| 4,124,410 A | * | 11/1978 | Kotval et al. | 136/258 |
| 4,571,448 A | * | 2/1986 | Barnett | 136/259 |

(Continued)

FOREIGN PATENT DOCUMENTS

WO    WO 2006097189 A1 *  9/2006

OTHER PUBLICATIONS

Stangl et al., Amorphous/Crystalline Silicon heterojunction solar cells—a simulation study; 17th European Photovoltaic Conference, Munich, Oct. 2001.*

(Continued)

*Primary Examiner* — Shannon Gardner
(74) *Attorney, Agent, or Firm* — Shun Yao; Park, Vaughan, Fleming & Dowler LLP

(57) ABSTRACT

One embodiment of the present invention provides a heterojunction solar cell. The solar cell includes a metallurgical-grade Si (MG-Si) substrate, a layer of heavily doped crystalline-Si situated above the MG-Si substrate, a layer of lightly doped crystalline-Si situated above the heavily doped crystalline-Si layer, a backside ohmic-contact layer situated on the backside of the MG-Si substrate, a passivation layer situated above the heavily doped crystalline-Si layer, a layer of heavily doped amorphous Si (a-Si) situated above the passivation layer, a layer of transparent-conducting-oxide (TCO) situated above the heavily doped a-Si layer, and a front ohmic-contact electrode situated above the TCO layer.

10 Claims, 2 Drawing Sheets

(56) References Cited

U.S. PATENT DOCUMENTS

2004/0103937 A1* 6/2004 Bilyalov et al. ............... 136/255
2008/0251117 A1* 10/2008 Schubert et al. ............. 136/255
2009/0283138 A1 11/2009 Lin
2010/0300507 A1* 12/2010 Heng et al. .................... 136/244

OTHER PUBLICATIONS

JCS Pires, J Otubo, AFB Braga, PR Mei; The purification of metallurgical grade silicon by electron beam melting, J of Mats Process Tech 169 (2005) 16-20.*

* cited by examiner

HETEROJUNCTION SOLAR CELL BASED ON EPITAXIAL CRYSTALLINE-SILICON THIN FILM ON METALLURGICAL SILICON SUBSTRATE DESIGN

RELATED APPLICATION

The present patent is a continuation-in-part of, and hereby claims priority under 35 U.S.C §120 to, U.S. Pat. No. 8,283,557, entitled "heterojunction Solar Cell Based on Epitaxial Crystalline-Silicon Thin Film on Metallurgical Silicon Substrate Design," by inventors Chentao Yu, Jiunn Benjamin Heng, Zheng Xu, Jianming Fu, and Jianjun Liang, filed on 10 Mar. 2009.

BACKGROUND

1. Field

This disclosure is generally related to solar cells. More specifically, this disclosure is related to a heterojunction solar cell fabricated by epitaxially depositing a crystalline-Si thin film on a metallurgical grade Si (MG-Si) substrate.

2. Related Art

The negative environmental impact caused by the use of fossil fuels and their rising cost have resulted in a dire need for cleaner, cheaper alternative energy sources. Among different forms of alternative energy sources, solar power has been favored for its cleanness and wide availability.

A solar cell converts light into electricity using the photoelectric effect. There are several basic solar cell structures, including a single p-n junction, p-i-n/n-i-p, and multi-junction. A typical single p-n junction structure includes a p-type doped layer and an n-type doped layer. Solar cells with a single p-n junction can be homojunction solar cells or heterojunction solar cells. If both the p-doped and n-doped layers are made of similar materials (materials with equal band gaps), the solar cell is called a homojunction solar cell. In contrast, a heterojunction solar cell includes at least two layers of materials of different bandgaps. A p-i-n/n-i-p structure includes a p-type doped layer, an n-type doped layer, and an intrinsic (undoped) semiconductor layer (the i-layer) sandwiched between the p-layer and the n-layer. A multi junction structure includes multiple single junction structures of different bandgaps stacked on top of one another.

In a solar cell, light is absorbed near the p-n junction generating carriers. The carriers diffuse into the p-n junction and are separated by the built-in electric field, thus producing an electrical current across the device and external circuitry. An important metric in determining a solar cell's quality is its energy-conversion efficiency, which is defined as the ratio between power converted (from absorbed light to electrical energy) and power collected when the solar cell is connected to an electrical circuit.

For homojunction solar cells, minority-carrier recombination at the cell surface due to the existence of dangling bonds can significantly reduce the solar cell efficiency; thus, a good surface passivation process is needed. In addition, the relatively thick, heavily doped emitter layer, which is formed by dopant diffusion, can drastically reduce the absorption of short wavelength light. Comparatively, heterojunction solar cells, such as Si heterojunction (SHJ) solar cells, are advantageous. FIG. 1 presents a diagram illustrating an exemplary SHJ solar cell (prior art). SHJ solar cell 100 includes front electrodes 102, an n$^+$ amorphous-silicon (n$^+$ a-Si) emitter layer 104, an intrinsic a-Si layer 106, a p-type doped crystalline-Si substrate 108, and an Al backside electrode 110. Arrows in FIG. 1 indicate incident sunlight. Because there is an inherent bandgap offset between a-Si layer 106 and crystalline-Si layer 108, a-Si layer 106 can be used to reduce the surface recombination velocity by creating a barrier for minority carriers. The a-Si layer 106 also passivates the surface of crystalline-Si layer 108 by repairing the existing Si dangling bonds. Moreover, the thickness of n$^+$ a-Si emitter layer 104 can be much thinner compared to that of a homojunction solar cell. Thus, SHJ solar cells can provide a higher efficiency with higher open-circuit voltage ($V_{oc}$) and larger short-circuit current ($J_{sc}$).

Fuhs et al. first reported a hetero-structure based on a-Si and crystalline-Si that generates photocurrent in 1974 (see W. Fuhs et al., "*Heterojunctions of amorphous silicon & silicon single crystal*", Int. Conf., Tetrahedrally Bonded Amorphous Semiconductors, Yorktown Hts., N.Y., (1974), pp. 345-350). U.S. Pat. No. 4,496,788 disclosed a heterojunction type solar cell based on stacked a-Si and crystalline-Si wafers. The so-called HIT (heterojunction with intrinsic thin layer) solar cell, which includes an intrinsic a-Si layer interposed between a-Si and crystalline-Si layers, was disclosed by U.S. Pat. No. 5,213,628. However, all these SHJ solar cells are based on a crystalline-Si substrate whose thickness can be between 200 μm and 300 μm. Due to the soaring cost of Si material, the existence of such a thick crystalline-Si substrate significantly increases the manufacture cost of existing SHJ solar cells. To solve the problem of high cost incurred by crystalline-Si wafers, this disclosure presents a solution for SHJ solar cells based on epitaxial mono-crystalline Si thin film grown on low-cost MG-Si wafers.

SUMMARY

One embodiment of the present invention provides a heterojunction solar cell. The solar cell includes a metallurgical-grade Si (MG-Si) substrate, a layer of heavily doped crystalline-Si situated above the MG-Si substrate, a layer of lightly doped crystalline-Si situated above the heavily doped crystalline-Si layer, a backside ohmic-contact layer situated on the backside of the MG-Si substrate, a passivation layer situated above the heavily doped crystalline-Si layer, a layer of heavily doped amorphous Si (a-Si) situated above the passivation layer, a layer of transparent-conducting-oxide (TCO) situated above the heavily doped a-Si layer, and a front ohmic-contact electrode situated above the TCO layer.

In a variation on the embodiment, the MG-Si substrate has a purity of at least 99.9%, and the doping type of the MG-Si is same as the heavily doped crystalline-Si layer.

In a further variation, the surface of the MG-Si substrate is further purified at a high temperature in an atmosphere of H$_2$ and HCl.

In a variation on the embodiment, the heavily doped crystalline-Si layer acts as a back-surface-field (BSF) layer. The heavily doped crystalline-Si layer is deposited using a chemical-vapor-deposition (CVD) technique. The thickness of the heavily doped crystalline-Si layer is between 1 μm and 10 μm. The doping concentration for the heavily doped crystalline-Si layer is between $1 \times 10^{17}/cm^3$ and $1 \times 10^{20}/cm^3$.

In a variation on the embodiment, the lightly doped crystalline-Si layer is deposited using a CVD technique. The thickness of the lightly doped crystalline-Si layer is between 5 μm and 100 μm, and wherein the doping concentration for the lightly doped crystalline-Si layer is between $1 \times 10^{16}/cm^3$ and $1 \times 10^{17}/cm^3$.

In a variation on the embodiment, the thickness of the passivation layer is between 1 nm and 15 nm, and the passivation layer includes at least one of: undoped a-Si and SiO$_x$.

In a variation on the embodiment, the heavily doped a-Si layer is deposited using a CVD technique. The thickness of the heavily doped a-Si layer is between 1 nm and 50 nm. The doping concentration for the heavily doped a-Si layer is between $1\times10^{17}/cm^3$ and $1\times10^{20}/cm^3$.

In a variation on the embodiment, the heavily doped and lightly doped crystalline-Si layers are p-type doped, and the heavily doped a-Si layer is n-type doped.

In a variation on the embodiment, the heavily doped and lightly doped crystalline-Si layers are n-type doped, and the heavily doped a-Si layer is p-type doped

BRIEF DESCRIPTION OF THE FIGURES

In the figures, like reference numerals refer to the same figure elements.

DETAILED DESCRIPTION

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present invention is not limited to the embodiments shown, but is to be accorded the widest scope consistent with the principles and features disclosed herein.

Overview

Embodiments of the present invention provide a SHJ solar cell fabricated by epitaxially depositing a crystalline-Si thin film on a MG-Si substrate. A thin layer of heavily doped crystalline-Si is deposited on the surface of the MG-Si substrate forming a back-surface-field (BSF) layer, and a thin layer of lightly doped crystalline-Si is deposited on top of the heavily doped crystalline-Si layer to form a base layer. An intrinsic thin layer of a-Si is deposited on the base layer to work as a passivation layer. The emitter layer is formed by depositing a heavily doped a-Si layer. Before the formation of front metal electrodes, transparent-conducting-oxide (TCO) is deposited to form front electrode and an anti-reflective layer.

Fabrication Process

Figure 1:
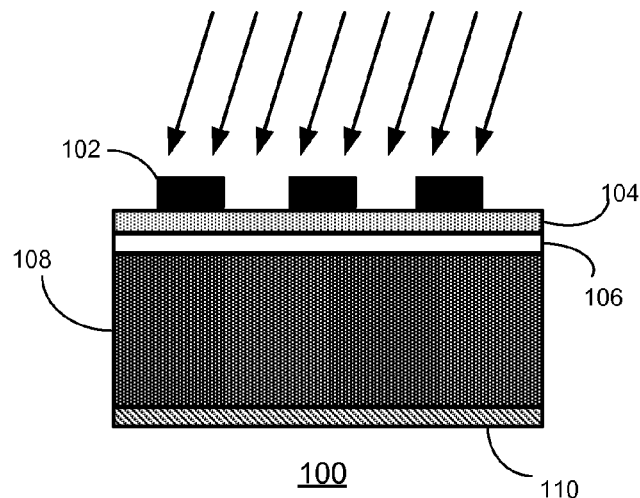
FIG. 1 presents a diagram illustrating an exemplary SHJ solar cell (prior art).
Figure 2:
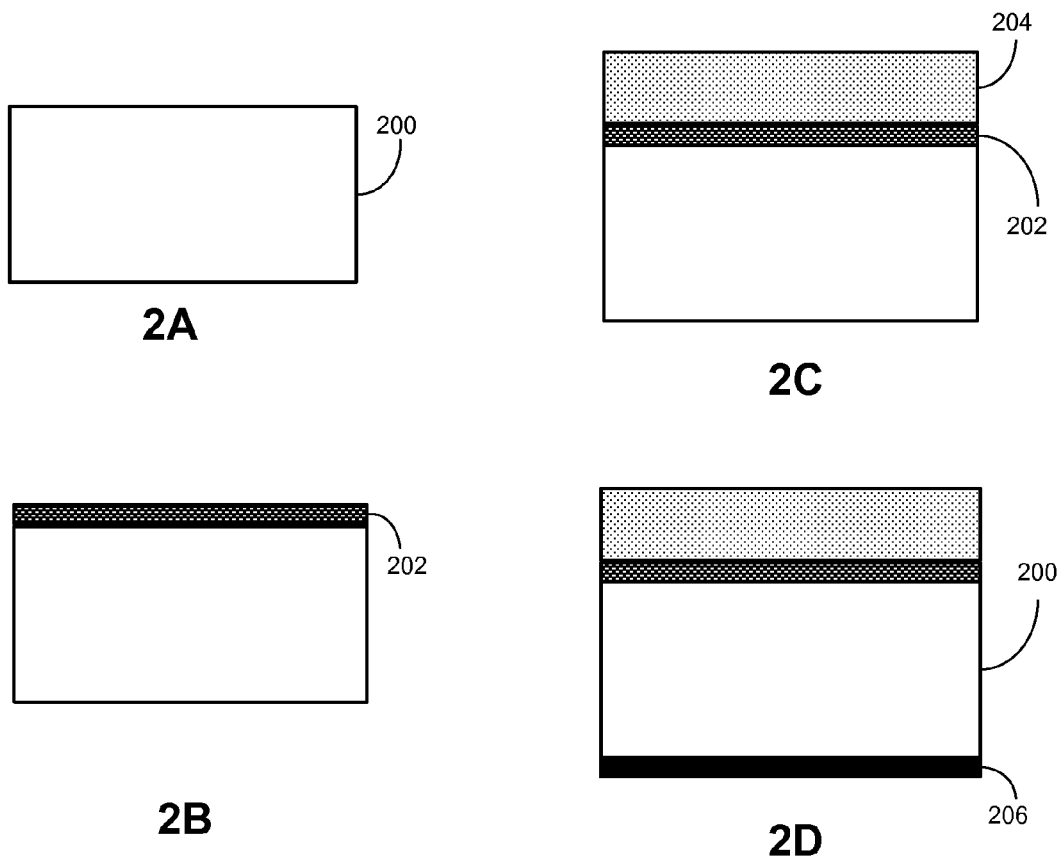
FIG. 2 presents a diagram illustrating the process of fabricating a heterojunction solar cell in accordance with an embodiment of the present invention. 2A illustrates a MG-Si substrate. 2B illustrates a thin layer of heavily doped crystalline-Si thin film grown on top of the MG-Si substrate. 2C illustrates a layer of lightly doped crystalline-Si base film grown on top of the heavily doped crystalline-Si thin film. 2D illustrates a backside electrode formed on the backside of the MG-Si substrate. 2E illustrates a passivation layer deposited on top of the base film. 2F illustrates a heavily doped a-Si emitter layer deposited on the passivation layer. 2G illustrates a layer of transparent-conducting-oxide (TCO) deposited on top of the a-Si emitter layer. 2H illustrates front electrodes formed on top of the TCO layer.
Figure 2:
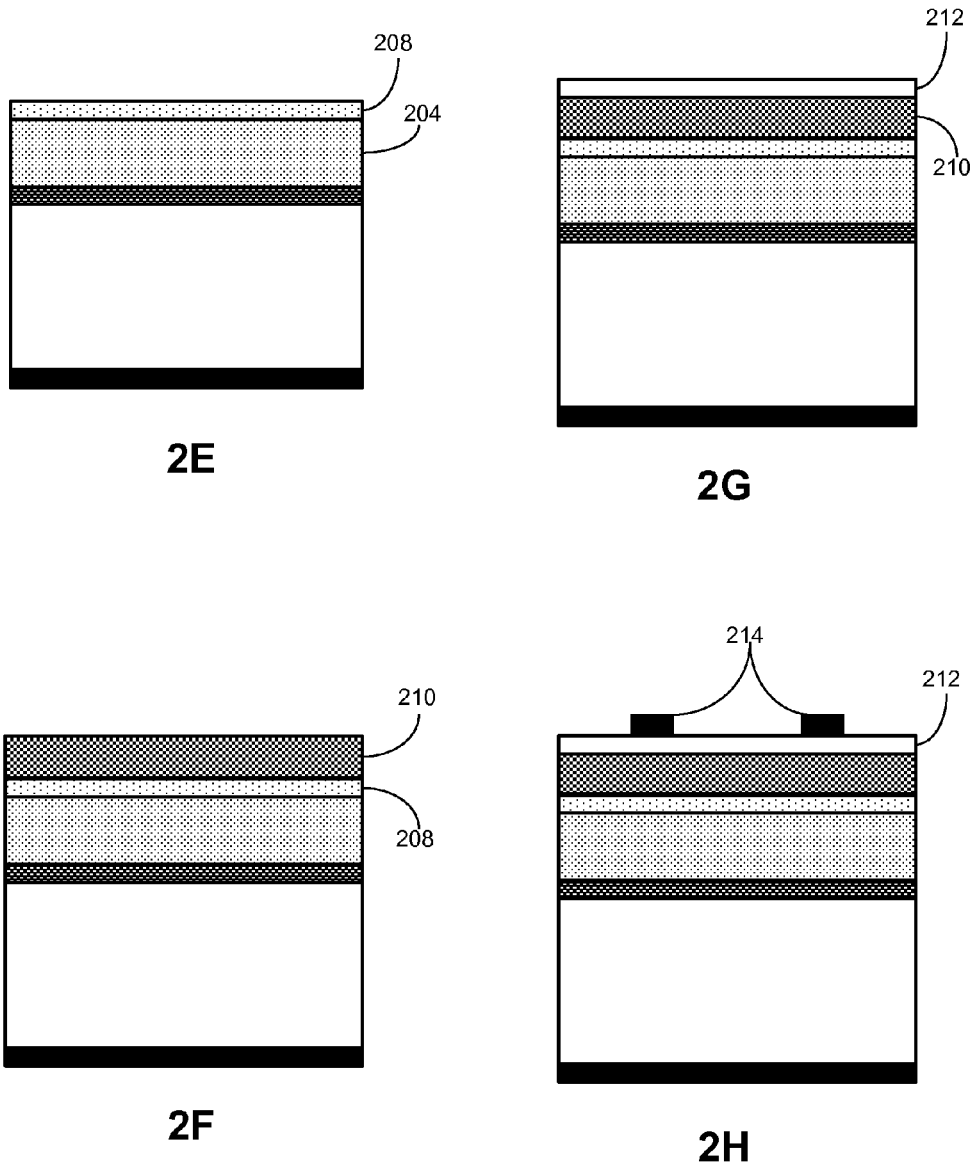

FIG. 2 presents a diagram illustrating the process of fabricating a heterojunction solar cell in accordance with an embodiment of the present invention.

In operation 2A, a MG-Si substrate 200 is prepared. Because MG-Si is much cheaper than solar grade or semiconductor grade crystalline-Si, solar cells based on MG-Si substrates have a significantly lower manufacture cost. The purity of MG-Si is usually between 98% and 99.99%. To ensure a high efficiency of the subsequently fabricated solar cell, the starting MG-Si substrate ideally has a purity of 99.9% or better. In addition, the surface of the MG-Si substrate needs to be further purified. In one embodiment, MG-Si substrate 200 is baked at a temperature between 1100° C. and 1250° C. in a chemical-vapor-deposition (CVD) chamber filled with hydrogen ($H_2$) in order to remove native siliconoxide in the substrate. Afterwards, at approximately the same temperature, hydrogen chloride (HCl) gas is introduced inside the CVD chamber to leach out any residual metal impurities from MG-Si substrate 200, thus further preventing the impurities from diffusing into the subsequently grown crystalline-Si thin films. Due to the fact that metal impurities, such as iron, have a high diffusion coefficient at this temperature, the metal impurities tend to migrate to the surface of substrate 200, and react with the HCl gas to form volatile chloride compounds. The volatile chloride compounds can be effectively purged from the chamber using a purge gas, such as $H_2$. Note that the metal-impurity leaching process can be carried out either in the CVD chamber, which is subsequently used for the growth of crystalline-Si thin films, or in another stand-alone furnace. The metal-impurity leaching process can take between 1 minute and 120 minutes. MG-Si substrate 200 can be either p-type doped or n-type doped. In one embodiment, MG-Si substrate is p-type doped.

In operation 2B, a thin layer of heavily doped (doping concentration greater than $1\times10^{17}/cm^3$) crystalline-Si thin film 202 is epitaxially grown on the surface of MG-Si substrate 200. Various methods can be used to epitaxially grow crystalline-Si thin film 202 on MG-Si substrate 200. In one embodiment, crystalline-Si thin film 202 is grown using a thermal CVD process. Various types of Si compounds, such as $SiH_4$, $SiH_2Cl_2$, and $SiHCl_3$, can be used as a precursor in the CVD process to form crystalline-Si thin film 202. In one embodiment, $SiHCl_3$ (TCS) is used due to its abundance and low cost. Crystalline-Si thin film 202 can be either p-type doped or n-type doped. In one embodiment, boron is added to make thin film 202 p-type doped. The doping concentration of thin film 202 can be between $1\times10^{17}/cm^3$ and $1\times10^{20}/cm^3$, and the thickness of thin film 202 can be between 1 μm and 10 μm. The doping level should not exceed the limit, which may cause misfit dislocations in the film. Crystalline-Si thin film 202 is heavily doped to act as back-surface field (BSF) and barrier for reducing electron-hole recombination at the surface of the subsequently grown base film.

In operation 2C, a layer of lightly doped (doping concentration less than $1\times10^{17}/cm^3$) crystalline-Si base film 204 is epitaxially grown on top of thin film 202. The growing process of base film 204 can be similar to that used for thin film 202. Similarly, base film 204 can be either p-type doped or n-type doped. In one embodiment, base film 204 is lightly doped with a p-type dopant, such as boron. The doping concentration of base film 204 can be between $1\times10^{16}/cm^3$ and $1\times10^{17}/cm^3$, and the thickness of base film 204 can be between 5 μm and 100 μm. Note that compared with a conventional SHJ solar cell that uses a crystalline-Si wafer as a base layer, embodiments of the present invention use an epitaxially deposited crystalline-Si film as a base layer, which can be much thinner than a crystalline-Si wafer. As a result, the manufacture cost of SHJ solar cells can be significantly reduced. After deposition, the surface of base film 204 can be textured to maximize light absorption inside the solar cell, thus further enhancing efficiency. The surface texturing can be performed using various etching techniques including dry plasma etching and wet etching. The etchants used in the dry plasma etching include, but are not limited to: $SF_6$, $F_2$, and $NF_3$. The wet etching etchant can be an alkaline solution. The shapes of the surface texture can be pyramids or inverted pyramids, which are randomly or regularly distributed on the surface of base film 204.

In operation 2D, a backside electrode 206 is formed on the backside of MG-Si substrate 200. In one embodiment, electrode 206 is formed by first coating a layer of aluminum paste on the backside of MG-Si substrate 200 and then firing it at a temperature of above 500° C. to form ohmic contact between electrode 206 and substrate 200.

In operation 2E, a passivation layer 208 is deposited on top of base film 204. Passivation layer 208 can significantly reduce the density of surface carrier recombination, thus increasing the solar cell efficiency. Passivation layer 208 can be formed using different materials such as intrinsic a-Si or silicon-oxide ($SiO_x$). Techniques used for forming passivation layer 208 include, but are not limited to: PECVD, sputtering, and electron beam (e-beam) evaporation. The thickness of passivation layer 208 can be between 1 nm and 15 nm.

In operation 2F, a heavily doped a-Si layer is deposited on passivation layer 208 to form an emitter layer 210. Depending on the doping type of base film 204, emitter layer 210 can be either n-type doped or p-type doped. In one embodiment, emitter layer 210 is heavily doped with an n-type dopant. The doping concentration of emitter layer 210 can be between $1\times10^{17}/cm^3$ and $1\times10^{20}/cm^3$. The thickness of emitter layer 210 can be between 1 nm and 50 nm. Techniques used for depositing emitter layer 210 include PECVD. Because the thickness of emitter layer 210 can be much smaller compared with that of the emitter layer in a homojunction solar cell, the absorption of short wavelength light is significantly reduced, thus leading to a higher solar cell efficiency.

In operation 2G, a layer of transparent-conducting-oxide (TCO) is deposited on top of emitter layer 210 to form an anti-reflective layer 212. Examples of TCO include, but are not limited to: indium-tin-oxide (ITO), aluminum doped zinc-oxide (ZnO:Al), or Ga doped zinc-oxide (ZnO:Ga). Techniques used for forming anti-reflective layer 212 include, but are not limited to: PECVD, sputtering, and e-beam evaporation.

In operation 2H, metal front electrodes 214 are formed on top of anti-reflective layer 212. Front metal electrodes 214 can be formed using various metal deposition techniques at a low temperature of less than 400° C. In one embodiment, front electrodes 214 are formed by screen printing Ag paste. After the formation of front electrodes 214, various techniques such as laser scribing can be used for cell isolation to enable series interconnection of solar cells.

The foregoing descriptions of various embodiments have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention.

What is claimed is:

1. A heterojunction solar cell, comprising:
a metallurgical-grade Si (MG-Si) substrate that has undergone a process of metal-impurity leaching;
a layer of heavily doped epitaxial mono-crystalline-Si situated above the MG-Si substrate, wherein the heavily doped epitaxial mono-crystalline-Si layer is in direct contact with the MG-Si substrate, and wherein the heavily doped epitaxial mono-crystalline-Si layer acts as a back-surface field (BSF) layer;
a layer of lightly doped epitaxial mono-crystalline-Si situated above the heavily doped epitaxial mono-crystalline-Si layer, wherein the lightly doped epitaxial mono-crystalline-Si layer acts as a base layer;
a backside ohmic-contact layer situated on the backside of the MG-Si substrate;
a passivation layer situated above the heavily doped epitaxial mono-crystalline-Si BSF layer;
a layer of heavily doped amorphous Si (a-Si) situated above the passivation layer;
a layer of transparent-conducting-oxide (TCO) situated above the heavily doped a-Si layer; and
a front ohmic-contact electrode situated above the TCO layer.

2. The heterojunction solar cell of claim 1, wherein a doping type of the MG-Si substrate is the same as that of the heavily doped epitaxial mono-crystalline-Si BSF layer.

3. The heterojunction solar cell of claim 1, wherein the metal-impurity leaching process is performed at a high temperature in an atmosphere of $H_2$ and HCl.

4. The heterojunction solar cell of claim 1, wherein the heavily doped epitaxial mono-crystalline-Si BSF layer is deposited using a chemical-vapor-deposition (CVD) technique, wherein the thickness of the heavily doped epitaxial mono-crystalline-Si BSF layer is between 1 μm and 10 μm, and wherein the doping concentration for the heavily doped epitaxial mono-crystalline-Si BSF layer is between $1\times10^{17}/cm^3$ and $1\times10^{20}/cm^3$.

5. The heterojunction solar cell of claim 1, wherein the lightly doped epitaxial mono-crystalline-Si base layer is deposited using a CVD technique, wherein the thickness of the lightly doped epitaxial mono-crystalline-Si base layer is between 5 μm and 100 μm, and wherein the doping concentration for the lightly doped crystalline-Si base layer is between $1\times10^{16}/cm^3$ and $1\times10^{17}/cm^3$.

6. The heterojunction solar cell of claim 1, wherein the passivation layer includes at least one of: undoped a-Si and $SiO_x$.

7. The heterojunction solar cell of claim 1, wherein the heavily doped a-Si layer is deposited using a CVD technique, wherein the thickness of the heavily doped a-Si layer is between 1 nm and 50 nm, and wherein the doping concentration for the heavily doped a-Si layer is between $1\times10^{17}/cm^3$ and $1\times10^{20}/cm^3$.

8. The heterojunction solar cell of claim 1, wherein the heavily doped mono-crystalline-Si BSF layer and lightly doped mono-crystalline-Si base layer are p-type doped, and wherein the heavily doped a-Si layer is n-type doped.

9. The heterojunction solar cell of claim 1, wherein the heavily doped mono-crystalline-Si BSF layer and lightly doped mono-crystalline-Si base layer are n-type doped, and wherein the heavily doped a-Si layer is p-type doped.

10. The heterojunction solar cell of claim 1, wherein a thickness of the passivation layer is between 1 nm and 15 nm.

* * * * *